United States Patent [19]

Ito

[11] 4,348,770
[45] Sep. 7, 1982

[54] MANUAL CHANNEL SELECTION APPARATUS

[75] Inventor: Tatsuo Ito, Kobe, Japan

[73] Assignee: Fujitsu-Ten, Ltd., Kobe, Japan

[21] Appl. No.: 217,321

[22] PCT Filed: Jan. 23, 1979

[86] PCT No.: PCT/JP79/00015

§ 371 Date: Sep. 24, 1979

§ 102(e) Date: Sep. 24, 1979

[87] PCT Pub. No.: WO79/00544

PCT Pub. Date: Aug. 9, 1979

[30] Foreign Application Priority Data

Jan. 24, 1978 [JP] Japan .............................. 53-7189[U]

[51] Int. Cl.³ ........................... H03J 7/26; H04B 1/26
[52] U.S. Cl. .................................... 455/164; 455/169; 455/182; 455/192
[58] Field of Search ............... 455/164, 167, 169, 173, 455/182, 192

[56] References Cited

U.S. PATENT DOCUMENTS

| | | |
|---|---|---|
| 3,467,870 | 1/1966 | Aoyama . |
| 3,821,650 | 6/1974 | Kase et al. .......................... 455/182 |
| 3,968,441 | 7/1976 | Garskamp .......................... 455/164 |
| 4,053,838 | 10/1977 | Amaya .............................. 455/164 |
| 4,240,115 | 12/1980 | Kamiya ............................. 455/164 |

Primary Examiner—Marc E. Bookbinder
Attorney, Agent, or Firm—Oblon, Fisher, Spivak, McClelland & Maier

[57] ABSTRACT

A channel selection apparatus comprising a circuit for facilitating the manual channel selection in an electronic tuning radio receiver. It comprises a group of gate circuits (30, 32, 34 and 36) which temporarily interrupt the instruction for the manual channel selection and inputs, instead, an AFC voltage to the control system (22 and 24) of a bias voltage to be applied to variable reactance elements (11) upon reception of a broadcasting wave.

1 Claim, 3 Drawing Figures

MANUAL CHANNEL SELECTION APPARATUS

FIELD OF THE INVENTION

This invention concerns a channel selection apparatus adapted to facilitate manual channel selection in electronic tuning radio receivers.

BACKGROUND OF THE INVENTION

Electronic channel selection can be attained using voltage-variable type reactance elements in tuning circuits of a radio receiver and providing a control voltage generation circuit therefor. The channel selection can be realized such as by a search channel selection system adapted to sweep the entire receiving frequency band from one direction or another direction (specifically, by the changes in a control voltage), stop the sweeping when a broadcasting station is caught and enter into receiving as it is if the station is a desired one or start the sweeping again by the push of a pushbutton if the station is not a desired one. A digital channel selection system is adapted to set the frequency for a desired broadcasting station previously in a digital manner and change the receiving frequency as far as the receiving frequency reaches the set frequency, or a manual channel selection system is adapted to manually maintain the gradual increase or decrease in a control voltage till a desired broadcasting station is caught. The applicant has already proposed various types of channel selection apparatus such as "Digital Setting Receiver" in Japanese Patent Application No. 39648/1976, "Automatic Channel Selection Apparatus" in Japanese Patent Application No. 40024/1976 and "Electronic Tuning Radio Receiver" in Japanese Patent Application No. 129831/1976.

This invention concerns, among the above systems, a manual channel selection system, which is adapted to facilitate the channel selecting operation. The manual channel selection in the prior system is adapted to perform the channel selection by gradually increasing or decreasing the control voltage, in order to identify, upon reception of a broadcasting wave, if it is a desired broadcasting station or not by listening to it or observing the indication on a dial and enter into receiving state if it is a desired one by interrupting the changes in the control voltage. The station is passed momentarily in a frequency band where broadcasting stations are densely populated thus causing difficulty in the channel selection, since the channel selection speed, although relatively slow, is such a rate as sweeping the full scale in about 20–30 seconds, that is, 5–6 stations per one second in an AM band (10 KHz intervals between each of the stations).

SUMMARY OF THE INVENTION

It is, accordingly, an object of this invention to interrupt the sweeping operation temporarily when a broadcasting wave is received thereby providing a sufficient time to determine whether the broadcasting wave, that is, the broadcasting station is a desired one or not.

Another object of this invention is to enable a clear listening to the broadcasting by the fine control of a control voltage with an AFC voltage during interruption of the sweeping.

According to this invention, a gate circuit is provided for the control of an input signal to a voltage source which supplies a bias voltage to variable reactance elements in an electronic tuning radio receiver and, upon reception of a broadcasting wave, an input signal from a manual channel selection switch is temporarily interrupted and, instead, an AFC signal is inputted. This interrupts the frequency sweeping to enable a radio audience to clearly hear the broadcasting and judge whether it is a desired one or not.

Other objects, constitutions and advantages of this invention will be made clearer by the following descriptions referring to the accompanying drawings.

DETAILED DESCRIPTION OF THE PREFERRED EMBODIMENTS

Figure 1:
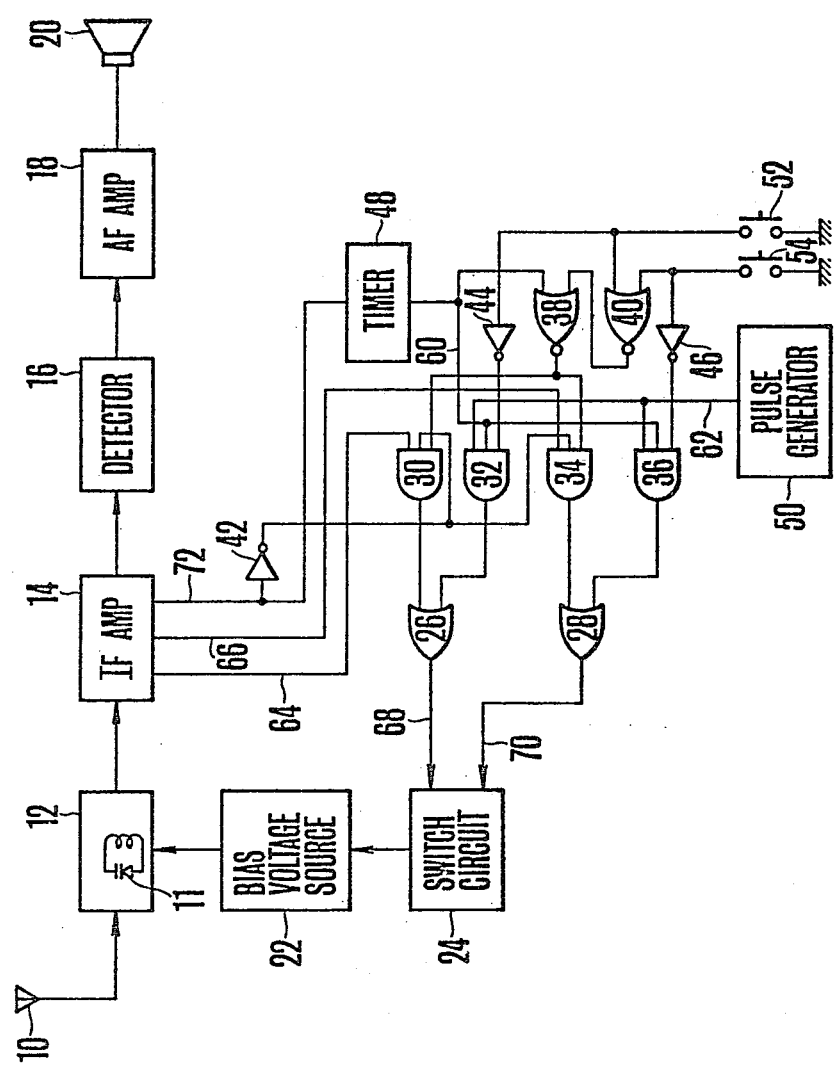
FIG. 1 is a block diagram showing an embodiment of this invention.

Referring now to FIG. 1, there is shown a receiving antenna 10, a high frequency amplifying and local oscillation stage 12, an intermediate frequency amplifying stage 14, a detection stage 16, a low frequency amplifying stage 18 and a speaker 20, which constitute an ordinary superheterodyne type radio receiver, and a voltage-variable capacitance diode is used for a variable reactance element 11 in a tuning circuit since the receiver in this embodiment is that of an electronic tuning type. A bias voltage source 22, for supplying a bias voltage (control voltage) to the above variable reactance element, consists of an integrating circuit (capacitor charge and discharge circuit) and outputs the above bias voltage which gradually increases upon input of a positive voltage and gradually decreases upon input of a negative voltage. The switching circuit 24 issues the above positive voltage upon input of an upward signal from a lead 68 and output the above negative voltage upon input of a downward signal from a lead 70. The switching circuit 24 is, in principle, has a positive and a negative voltage source and a switching element turned ON and OFF with the above upward and downward signals and consists of a digital multiplexer or the like for switching signals in each of the foregoing various types of channel selection systems. Reference numerals 30, 32, 34 and 36 are AND gates, 38 and 40 are NOR gates, 42, 44 and 46 are inverters, 48 is a timer, 50 is a pulse generator and 52 and 54 are manual channel selection switches for each of the upward and downward directions. These switches are grounded at one of their terminals to the earth, while the other terminal of the switch 52 is connected by way of the inverter 44 to one input terminal of the AND gate 32 and directly to one input terminal of the NOR gate 40, and the other terminal of the switch 54 is connected by way of the inverter 46 to one input terminal of the AND gate 36 and directly to the other input terminal of the NOR gate 40. The output of the timer 48 is connected by way of a lead 60 to the AND gates 32 and 36 and also to the NOR gate 38. The output of the pulse generator 50 is connected by way of a lead 62 to the AND gates 32 and 36. The intermediate frequency amplifying stage 14 issues an intermediate frequency output, which is turned to "L" level upon reception of a broadcasting wave, through a lead 72 connected to its AVC terminal, and also issues an AFC (automatic frequency control) signal for instructing the frequency upwarding through a lead 64 and an AFC signal for instructing the signal downwarding through a lead 66.

Figure 2:
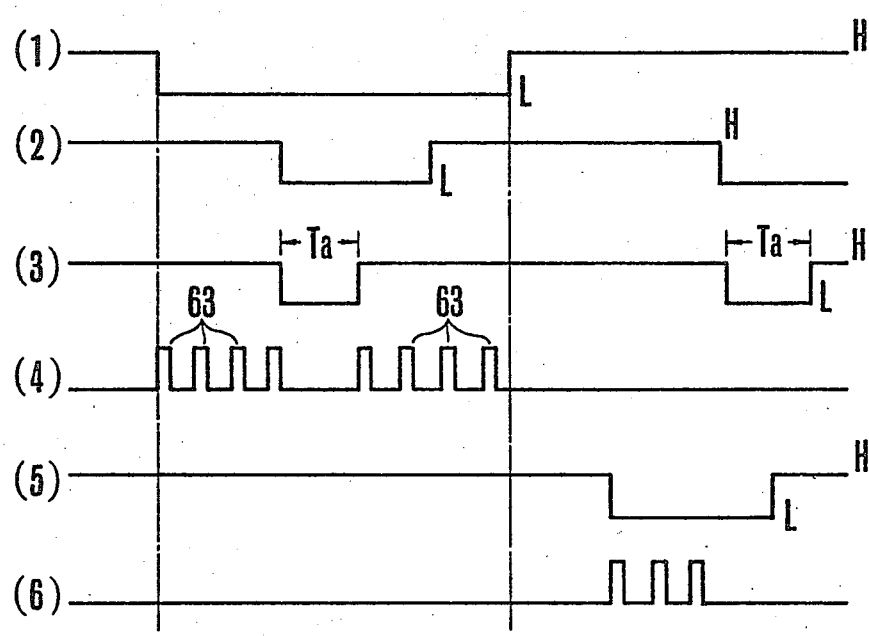
FIG. 2 is a waveform chart showing examples of signal waveforms in each of the sections in FIG. 1.
Figure 3:
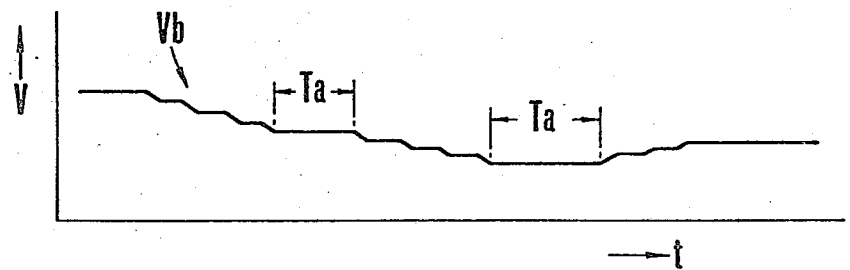
FIG. 3 is a waveform chart for the output voltage from a bias voltage source.

The operation of the circuit in FIG. 1 will now be explained in conjunction with the waveform chart in FIG. 2 and FIG. 3. When the downward channel selection switch 54 is pushed, for example, it outputs turns to "L" level as shown in FIG. 2(1), which is inverted in the inverter 46 into "H" level and, thereafter, enters the first input terminal of the AND gate 36. Since the output from the timer 48 normally at "H" level enters by way of the lead 60 to the second input terminal of the AND gate 36, the AND gate 36 opens to pass therethrough pulses 63 supplied from the pulse generator 50 to its third terminal by way of the lead 62. The pulses shown in FIG. 2(4) are inputted through the OR gate 28 into the switching circuit 24 causing it to output a pulse voltage of the negative polarity. The pulse voltage is inputted to the variable reactance element bias source 22 causing it to generate a decreasing bias voltage Vb which is decreased by one step on every arrival of one pulse as shown in FIG. 3. The bias voltage Vb is applied to the variable reactance element such as a voltage variable reactance diode in the tuning circuits, increases its reactance value and thereby drives the tuning frequency, that is, the receiving frequency downwardly. The manual channel selection is thus started.

Upon push of the manual channel selection switch 54, its L level output enters also to one input of the NOR gate 40. Since the manual channel selection switch 52 is kept OFF then, the other input of the above gate 40 is at H (high) level and, accordingly, the output from the gate 40 takes "L" level. While the "L" level output enters one of the input terminals of the NOR gate 38, the output of the gate 38 is at "L" level since the output from the timer 48 supplied to the other input terminal of the gate is now at a "H" level. The L level output enters the first input terminals of the AND gates 30 and 34. An "L" level signal of the intermediate frequency output from the intermediate frequency amplifying stage 14 (this may be the output from a discriminator), which is at "H" level when no broadcasting wave is received and inverted by the inverter 42, is inputted to the second terminals of these AND gates. Consequently, these gates 30 and 34 are closed.

As the manual channel selection is proceeded and when a broadcasting wave is received, the intermediate frequency output from the intermediate frequency amplifying stage 14 turns to "L" level as shown in FIG. 2(2). The timer 48 produces an output which falls in timing with the fall of the output (2) and remains at "L" level for a certain period Ta as shown in FIG. 2(3). Since the "L" level output from the timer 48 is applied by way of the lead 60 to the AND gates 32 and 36, the AND gate 36 is closed to cease the issue of the pulses 63 from the pulse generator circuit 50 is shown in FIG. 2(4). This interrupts the increase in the bias voltage Vb and the channel selecting operation is interrupted temporarily. While on the other hand, the output from the AVC terminal of the intermediate frequency amplifying stage 14 is inverted in the inverter 42 into "H" level and the output from the NOR gate 38 also takes H level, which opens the AND gate 30 and 34 and inputs the automatic frequency control signals in the upward and downward directions issued from the intermediate frequency amplifying stage 14 through the leads 64 and 66, the AND gates 30 and 34 and the OR gates 26 and 28 to the charge and discharge switching circuit 24. AFC action is therefore applied to the radio receiver to result in fine increase or decrease in the receiving frequency during the temporary interruption for the channel selection in the manual channel selection and to thereby enable exact tuning and thus receiving.

In the temporary interruption period Ta, the radio audience judges whether the receiving wave is a desired one or not and, if it is a desired one, completes the channel selecting operation by the release of the channel selection switch 54 and then enters the receiving state. If the receiving wave is not a desired one, the audience has only to keep the channel selection switch 54 to push, in which the output of the timer 48 takes "H" level after the end of the interruption period Ta and the AND gate 36 is opened to start the channel selection again. On the other hand, since the output from the inverter 42 turns to "L" level, the switches 30 and 34 are closed to stop the supply of the AFC signal to the charge and discharge circuit 24.

The same operation is also executed in pushing the upward channel selection switch 52. Specifically, upon push of the switch 52, the output from the switch turns to "L" level as shown in FIG. 2(5), which is inputted by way of the inverter 44 as "H" level signal to the AND gate 32 to open the gate and thereby input the pulses from the pulse generator circuit 50 through the OR gate 26 to the charge and discharge switching circuit 24. As a result, the circuit 24 applies a pulse voltage of the positive polarity to the variable reactance bias source 22, and the bias source 22 produces an increasing bias voltage to start upward (in the direction of gradual frequency increase) channel selection. When a broadcasting wave is received, the intermediate frequency output from the intermediate frequency amplifying stage 14 turns to "L" level turning the output from the timer 48 to "L" level for a certain period and causing the AND gate 32 to close and the AND gates 30 and 34 to open thereby conducting temporary interruption for the channel selection and automatic frequency control.

As apparent from the foregoing descriptions, according to this invention, since the channel selecting operation is interrupted temporarily during the manual channel selection upon reception of a broadcasting wave to afford a radio audience to judge whether the receiving broadcasting wave is a desired one or not, the manual channel selection can be performed with ease. In addition, since the automatic frequency control is performed during the above temporary interruption for the channel selection, clear reception for the broadcasting wave is enable, by which the judgement as to the decision of the desired broadcasting station can be made through hearing with ease and securely.

This invention is not restricted to the embodiment illustrated and described above but can be modified in various ways within the scope of the claim.

I claim:

1. A manual channel selection apparatus in an electronic tuning radio receiver having variable reactance elements comprising:

manual selection switches for each of the upward and downward directions;

voltage source for generating a bias voltage which is gradually increased or decreased during input of an upward signal or a downward signal and applied to said reactance elements; and gate circuit means for temporarily interrupting the upward or downward output signal from said switches to said voltage source upon reception of a broadcasting wave and inputting an automatic frequency control voltage to said voltage source during said interruption whereby said gate circuit means includes a first logic means for passing the output of a pulse generator therethrough while the upward manual channel selection switch is being pushed and during issue of an "H" level output from a timer which issues "L" level output for a certain period upon generation of an intermediate frequency output, further including a second logic means for passing the output of said pulse generator therethrough while the downward manual channel selection switch is being pushed and during issue of an "H" level output from said timer, and a third and a fourth logic means for passing therethrough an automatic frequency control signal in the upward or the downward direction respectively while said timer issues an "L" level output and either of the upward or the downward manual selection switch is being pushed.

* * * * *

UNITED STATES PATENT AND TRADEMARK OFFICE
CERTIFICATE OF CORRECTION

PATENT NO. : 4,348,770
DATED : September 7, 1982
INVENTOR(S) : TATSUO ITO

It is certified that error appears in the above—identified patent and that said Letters Patent is hereby corrected as shown below:

At column 2, line 41, delete "is";

At column 3, line 28, change "L" to --"L"--;

At column 3, line 61, change "H" to --"H"--;

At column 4, line 49, change "enable" to --enabled--; and,

At column 4, line 51, change "securely" to --security--.

Signed and Sealed this

Fourteenth Day of June 1983

[SEAL]

Attest:

DONALD J. QUIGG

Attesting Officer

Acting Commissioner of Patents and Trademark